(12) United States Patent
Peng et al.

(10) Patent No.: US 10,490,693 B2
(45) Date of Patent: Nov. 26, 2019

(54) LED PACKAGE STRUCTURE AND MANUFACTURING METHOD THEREOF

(71) Applicants: LITE-ON OPTO TECHNOLOGY (CHANGZHOU) CO., LTD., Changzhou, Jiangsu Province (CN); LITE-ON TECHNOLOGY CORPORATION, Taipei (TW)

(72) Inventors: Han-Hsing Peng, New Taipei (TW); Heng-I Lee, Taichung (TW); Kuo-Ming Chiu, New Taipei (TW); Meng-Sung Chou, New Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 113 days.

(21) Appl. No.: 15/168,752

(22) Filed: May 31, 2016

(65) Prior Publication Data

US 2017/0092804 A1    Mar. 30, 2017

Related U.S. Application Data

(60) Provisional application No. 62/232,522, filed on Sep. 25, 2015.

(51) Int. Cl.
*H01L 33/48* (2010.01)
*H01L 33/54* (2010.01)
(Continued)

(52) U.S. Cl.
CPC ........ *H01L 33/0095* (2013.01); *H01L 29/866* (2013.01); *H01L 33/486* (2013.01);
(Continued)

(58) Field of Classification Search
CPC ..... H01L 33/48; H01L 33/483; H01L 33/486; H01L 33/50; H01L 33/505; H01L 33/507;
(Continued)

(56) References Cited

U.S. PATENT DOCUMENTS 8,294,160 B2 * 10/2012 Suehiro .................. H01L 33/56
257/79
2009/0146176 A1 * 6/2009 Oishi .................... H01L 33/486
257/100
(Continued)

*Primary Examiner* — Daniel Whalen
*Assistant Examiner* — Scott Stowe
(74) *Attorney, Agent, or Firm* — Li & Cai Intellectual Property (USA) Office

(57) ABSTRACT

A manufacturing method of an LED package structure includes the steps as follows: providing an LED package structure assembly, which has a substrate layer, an LED chip set located on the substrate layer, and an encapsulating gel layer covering the LED chip set; taking a first blade to saw the LED package structure assembly from the encapsulating gel layer to the substrate layer until a plurality of sawing grooves are formed on the substrate layer; and taking a second blade to saw the LED package structure assembly along each sawing groove until the second blade passes through the substrate layer, thereby forming a plurality of LED package structures separated from each other. Wherein a hardness of the first blade is greater than that of the second blade, and a thickness of the second blade is less than that of the first blade.

20 Claims, 13 Drawing Sheets

(51) Int. Cl.
*H01L 33/00* (2010.01)
*H01L 29/866* (2006.01)
*H01L 33/56* (2010.01)
H01L 25/16 (2006.01)
H01L 33/62 (2010.01)
H01L 33/64 (2010.01)

(52) U.S. Cl.
CPC ............ *H01L 33/56* (2013.01); *H01L 25/167* (2013.01); *H01L 33/62* (2013.01); *H01L 33/644* (2013.01); *H01L 2224/48091* (2013.01); *H01L 2224/48227* (2013.01); *H01L 2224/97* (2013.01); *H01L 2924/181* (2013.01); *H01L 2933/005* (2013.01); *H01L 2933/0033* (2013.01); *H01L 2933/0066* (2013.01)

(58) Field of Classification Search
CPC ......... H01L 33/52; H01L 33/54; H01L 33/58; H01L 33/62
See application file for complete search history.

(56) References Cited

U.S. PATENT DOCUMENTS

2010/0102347 A1* 4/2010 Oyamada .............. H01L 33/486
257/98
2014/0299902 A1* 10/2014 Zimmerman ........... H01L 33/62
257/98

* cited by examiner

LED PACKAGE STRUCTURE AND MANUFACTURING METHOD THEREOF

TECHNICAL FIELD

The present invention relates to a light-emitting diode (LED); in particular, to an LED package structure and a manufacturing method thereof.

BACKGROUND ART

The conventional method for manufacturing an LED package structure adapts a single blade to saw an LED package structure assembly into a plurality of conventional LED package structures. The LED package structure assembly includes a substrate and an encapsulating gel stacked on the substrate, and the substrate and the encapsulating gel have different hardness. When the substrate and the encapsulating gel are sawed by using a single blade, the hardness of the encapsulating gel is less than that of the substrate, so a grind portion of the encapsulating gel is smaller than that of the substrate. Thus, after the above sawing process is implemented, an edge of the encapsulating gel usually protrudes from the adjacent edge of the substrate, such that the producing yield of the LED package structure is reduced.

In view of the above disadvantages, after extensive research in conjunction with theoretical knowledge, the inventor provides the present invention which is reasonably designed and effectively addresses the above disadvantages.

SUMMARY OF THE INVENTION

Embodiments of the present invention provide an LED package structure and a manufacturing method thereof for effectively addressing the potential problems of conventional LED package structures using the conventional method.

In summary, the LED package structure and the manufacturing method thereof provided in the instant disclosure, the encapsulating gel layer and part of the substrate layer are sawed by the first blade, and then the substrate layer is sawed by the second blade, which is softer and thinner than the first blade, so the side surface of the second portion of the encapsulating gel is approximately aligned with the outer side surface of the substrate, thereby effectively increasing the producing yield of the LED package structure.

In order to further understand the features and technical content of the present invention, reference is made to the following detailed description and accompanying drawings of the present invention. However, the description and accompanying drawings are only intended to illustrate the present invention, and do not limit the scope of the present invention.

DETAILED DESCRIPTION OF THE PREFERRED EMBODIMENTS

[Manufacturing Method of LED Package Structure]

Referring to FIG. 1 to FIG. 7, an embodiment of the present invention is shown. It should be first noted that the relevant quantities and shapes shown in the figures corresponding to this embodiment are only provided to illustrate particular implementations of the present invention for ease of understanding, and not to limit the scope of the present invention. In order to clearly disclose the instant embodiment, the figures corresponding to the following description are shown in planar views. The instant embodiment provides a manufacturing method of an LED package structure including the steps as follows.

Figure 1:
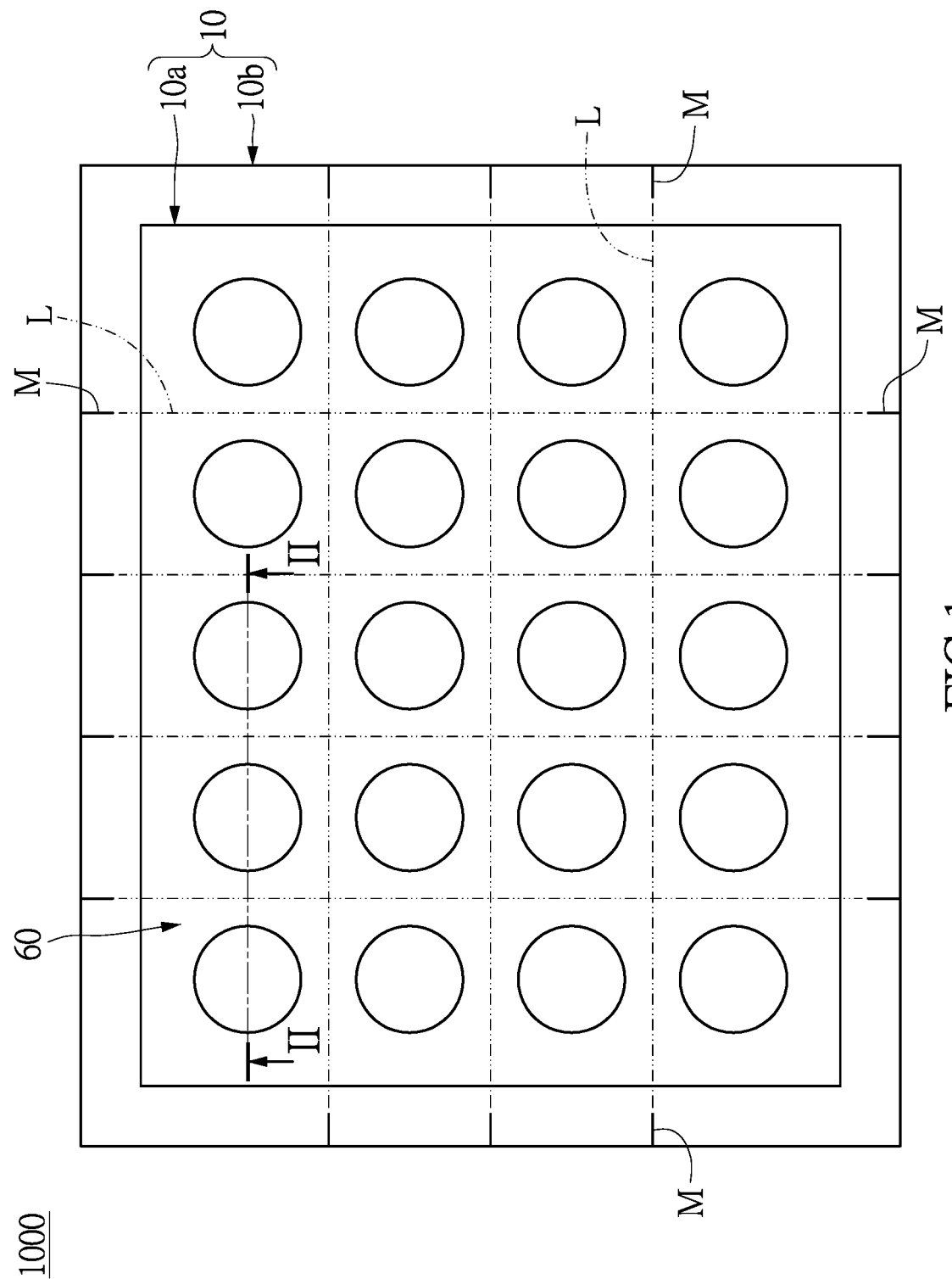
FIG. 1 is a schematic view showing a step S110 of a manufacturing method of an LED package structure.
Figure 2:
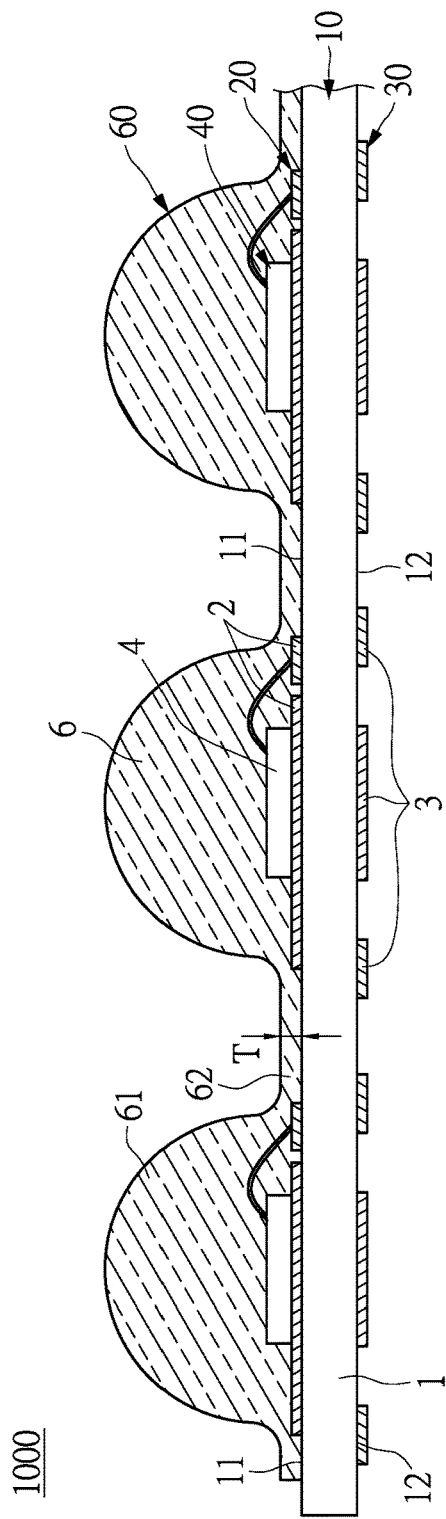
FIG. 2 is a cross-sectional view along line II-II of FIG. 1.

In Step S110, as shown in FIG. 1 and FIG. 2, an LED package structure assembly 1000 is provided. The LED package structure assembly 1000 includes a substrate layer 10, a first metallic layer 20, a second metallic layer 30, an LED chip set 40, a Zener chip set (not shown), and an encapsulating gel layer 60. The first metallic layer 20 and the second metallic layer 30 are respectively disposed on two opposite surfaces of the substrate layer 10. The LED chip set 40 and the Zener chip set (not shown) are disposed on the first metallic layer 20. The encapsulating gel layer 60 encapsulates the LED chip set 40, the first metallic layer 20 and the Zener chip set.

Figure 8:
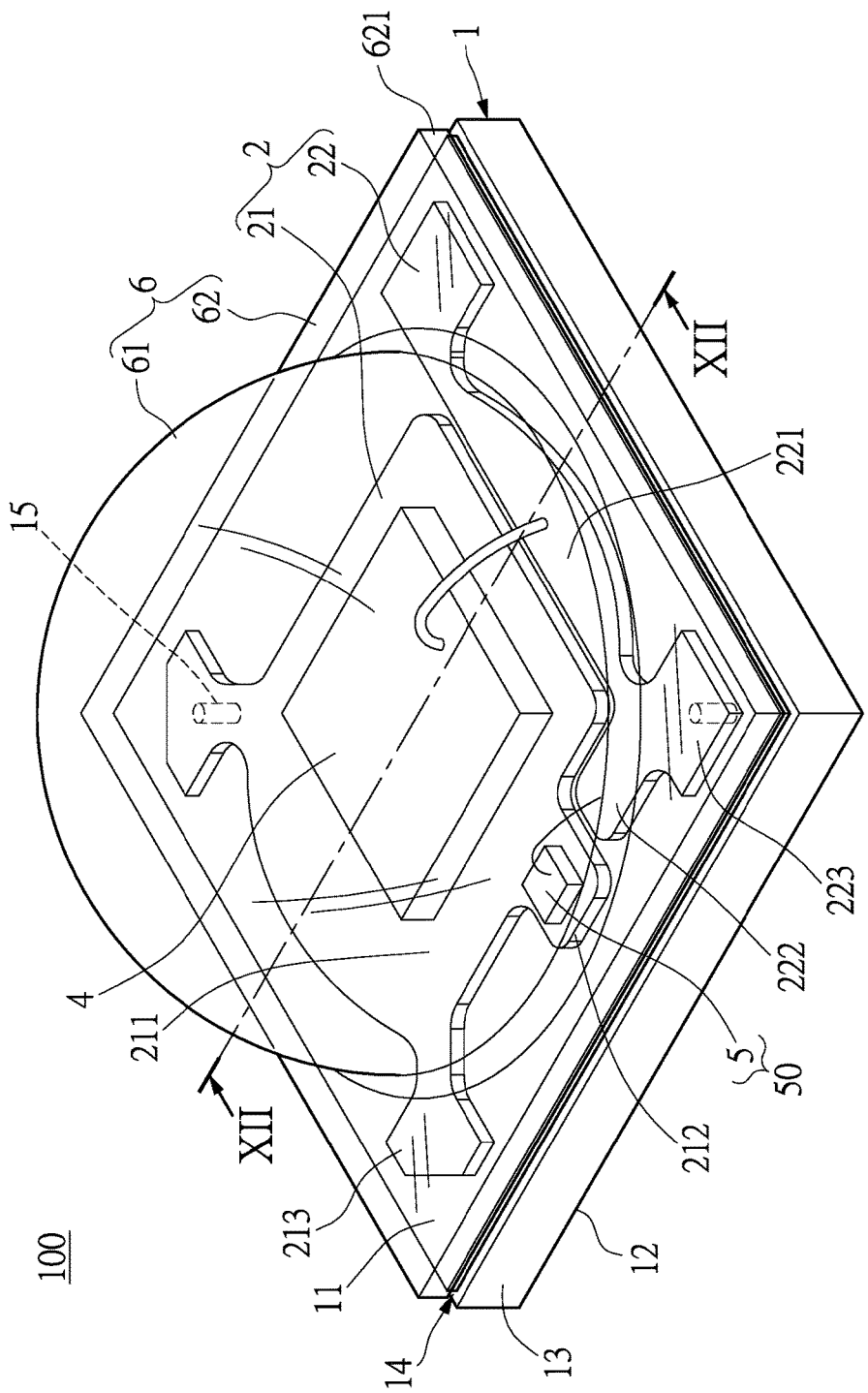
FIG. 8 is a perspective view showing the LED package structure according to the instant disclosure.

The substrate layer 10 includes an active area 10a and an inactive area 10b arranged around the active area 10a. The first metallic layer 20 and the second metallic layer 30 are formed on the active area 10a of the substrate layer 10, the first metallic layer 20 has a plurality of conductive circuits 2 formed on a top surface of the substrate layer 10, and the second metallic layer 30 has a plurality of metallic pad sets 3 formed on a bottom surface of the substrate layer 10. The LED chip set 40 includes a plurality of LED chips 4 disposed on the first metallic layer 20, and the Zener chip set includes a plurality of Zener chips 5 (as shown in FIG. 8) disposed on the first metallic layer 20. The encapsulating gel layer 60 is disposed on the active area 10a of the substrate layer 10. In other words, the encapsulating gel layer 60 is disposed on the first metallic layer 20, the LED chip set 40, and the Zener chip set.

Specifically, the LED package structure assembly 1000 defines a plurality of sawing lines L, which are in a vertical and horizontal arrangement. Each of the sawing lines L has a starting mark M and an ending mark M, which are formed on the inactive area 10b of the substrate layer 10. The active area 10a of the substrate layer 10 defines a plurality of substrates 1 according to the sawing lines L, and the substrates 1 are integrally connected to each other and are in a matrix arrangement. Each substrate 1 has a first board surface 11 and an opposite second board surface 12. The conductive circuits 2 are respectively formed on the first board surfaces 11 of the substrates 1, and the metallic pad sets 3 are respectively formed on the second board surfaces 12 of the substrates 1. The LED chips 4 are respectively fixed on the conductive circuits 2, and the Zener chips 5 are also respectively fixed on the conductive circuits 2. The encapsulating gel layer 60 defines a plurality of encapsulating gels 6 according to the sawing lines L, and the encapsulating gels 6 are integrally connected to each other and are in a matrix arrangement. The encapsulating gels 6 are respectively disposed on the first board surfaces 11 of the substrates 1, and each of the encapsulating gels 6 is provided to cover the corresponding LED chip 4, the corresponding Zener chip 5, and the corresponding conductive circuit 2.

For the material of each element of the LED package structure assembly 1000, the hardness of the substrate layer 10 is greater than that of the encapsulating gel layer 60. The substrate layer 10 in the instant embodiment is made of ceramic material, but is not limited thereto. The LED chip 4 is preferably a UV LED chip 4, and the LED chip 4 in the instant embodiment is a UVA LED chip 4 having a wavelength of 350~420 nm, but is not limited thereto.

Moreover, for the material of the encapsulating gel layer 60, the encapsulating gel layer 60 is made of methyl silicone resin, an elongation of the encapsulating gel layer 60 is greater than 100% and smaller than 250%, the elongation is preferably greater than 160% and smaller than 190%, and the best choice of the elongation in the instant embodiment is 175%. The Shore A hardness of the encapsulating gel layer 60 is in a range of 50~70. Preferably, the Shore A hardness of the encapsulating gel layer 60 is in a range of 50~60, and the best choice of the Shore A hardness in the instant embodiment is 52. A glass transition temperature (Tg) of the encapsulating gel layer 60 is smaller than −50° C., a refractive index of the encapsulating gel layer 60 is substantially 1.41. In addition, the encapsulating gel layer 60 of the instant disclosure does not have a degradation phenomenon generated by UV light emitted from the UV LED chip 4. Each encapsulating gel 6 of the encapsulating gel layer 60 has a first portion 61 and a second portion 62 arranged around the first portion 61, and the second portions 62 of the encapsulating gel layer 60 are arranged under the sawing lines L.

It should be noted that in order to implement the following sawing step, a thickness T of each second portion 62 of the encapsulating gel layer 60 arranged under the corresponding sawing line L is smaller than that of the substrate layer 10 and is substantially smaller than 150 μm. The thickness T is preferably 75~125 μm. Specifically, the thickness T relates to a light-emitting angle Θ of the LED chip 4, and the thickness T and the light-emitting angle Θ in the instant embodiment are satisfied with a formula: Θ=138.75−(1.2T/25.4).

For example, when the light-emitting angle Θ of the LED chip 4 is 135.15°, the thickness T of each second portion 62 of the encapsulating gel layer 60 arranged under the corresponding sawing line L is substantially 3 mil, which is equal to 75 μm. When the light-emitting angle Θ of the LED chip 4 is 131.55°, the thickness T of each second portion 62 of the encapsulating gel layer 60 arranged under the corresponding sawing line L is substantially 6 mil, which is equal to 150 μm. In the instant embodiment, the thickness T of each second portion 62 of the encapsulating gel layer 60 arranged under the corresponding sawing line L is preferably 100±25 μm, but is not limited thereto.

Figure 3:
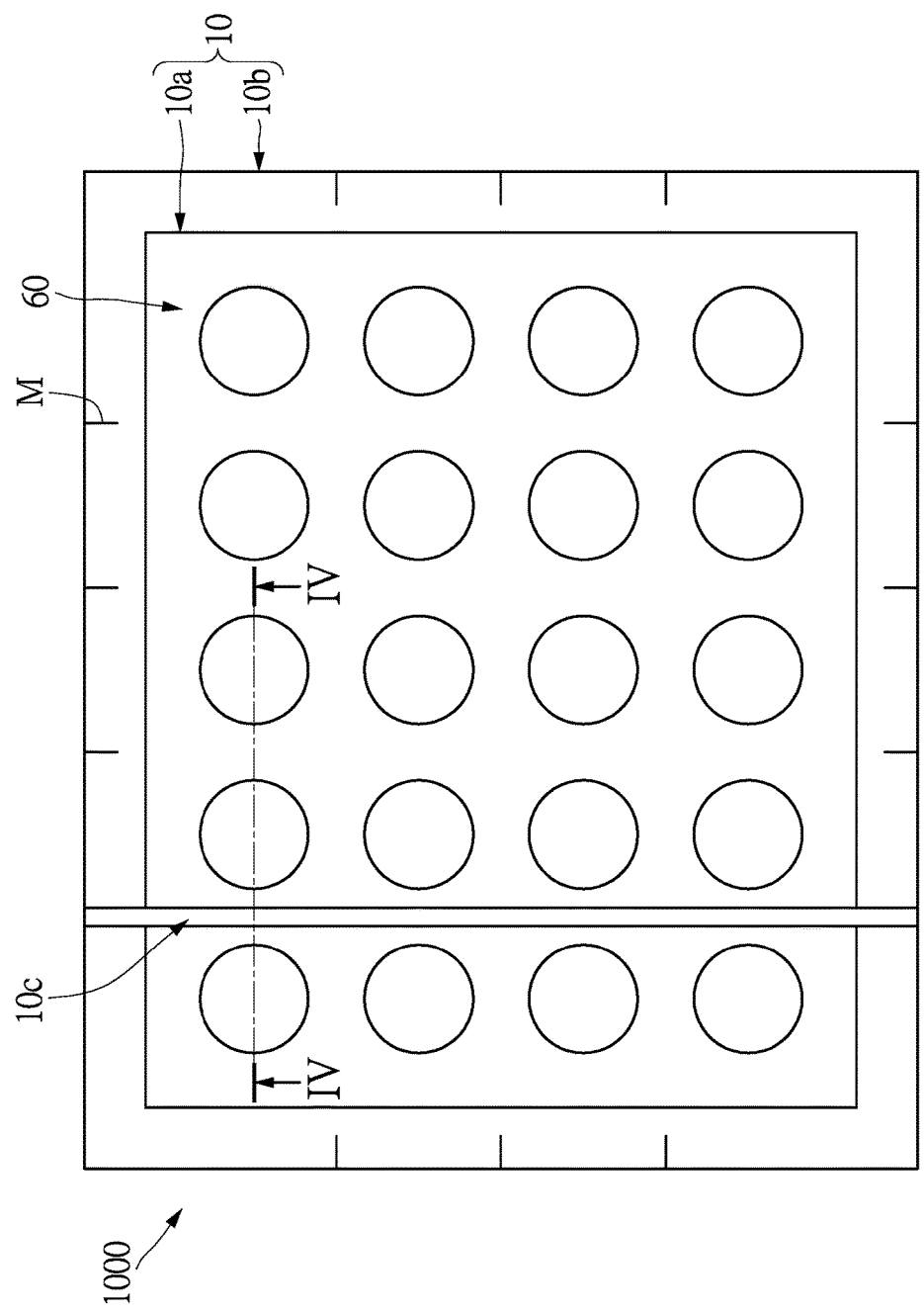
FIG. 3 is a schematic view showing a step S130 of the manufacturing method of the LED package structure.
Figure 4:
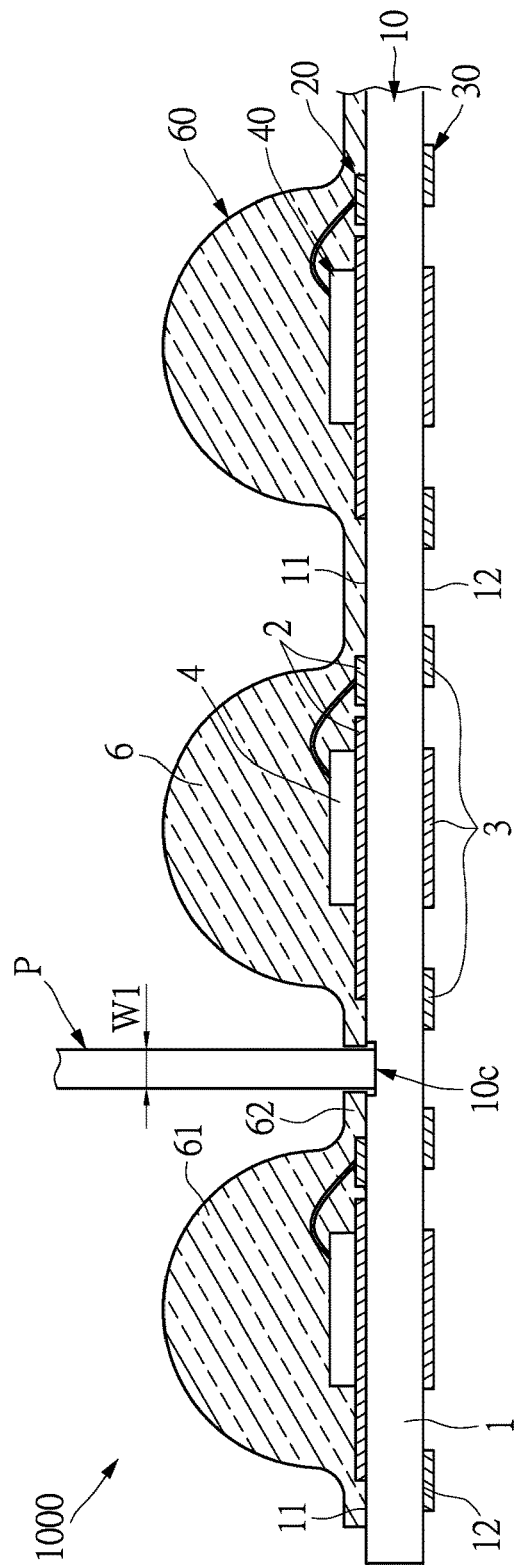
FIG. 4 is a cross-sectional view along line IV-IV of FIG. 3.

In Step S130, as shown in FIG. 3 and FIG. 4, the encapsulating gel layer 60 is sawed by using a first blade P to move along the sawing lines L until the substrate layer 10 is sawed. More particularly, the first blade P is not sawing through the substrate layer 10. That is to say, after the encapsulating gel layer 60 is sawed by using the first blade P to move along one of the sawing lines L, at least one sawing groove 10c is formed on the encapsulating gel layer 60 along the corresponding sawing line L.

The hardness of the first blade P is greater than that of the encapsulating gel layer 60, for example, the first blade P is a hard blade made of composite material. The thickness W1 of the first blade P implemented on the sawing lines L is 200~350 μm, and is preferably 250~300 μm. In the instant embodiment, the first blade P is a disc-shaped blade, in which a plurality of diamond powders is electroplated on the disc-shaped blade, and the first blade P is generally called as a P-blade. In other words, the first blade P is an electroplated diamond blade. The thickness W1 of the first blade P in the instant embodiment is 250 μm or 300 μm, but is not limited thereto.

When the first blade P is used to saw the LED package structure assembly 1000, the first blade P is aligned with the marks M of each sawing line L arranged on the inactive area 10b of the substrate layer 10 for accurately sawing along the sawing lines L. Moreover, the rotating speed of the first blade P is about 35000 rpm, the moving speed of the first blade P for sawing the LED package structure assembly 1000 is about 5 mm/s, velocity of a liquid for cooling the first blade P is about 1.5 L/min, and velocity of a liquid (e.g., water) for removing crumbs generated from the sawing of the LED package structure assembly 1000 is about 1 L/min at 20° C.

Specifically, a depth of the substrate layer 10 sawed by using the first blade P is substantially 75±25 μm, that is to say, the depth of each sawing groove 10c is substantially 75±25 μm. In other words, a distance between the second board surface 12 of each substrate 1 and the final position of the first blade P is about 0.48 mm. After the sawing process of the first blade P is implemented, the encapsulating gel layer 60 is sawed to be a plurality of encapsulating gels 6 separated from each other.

Figure 5:
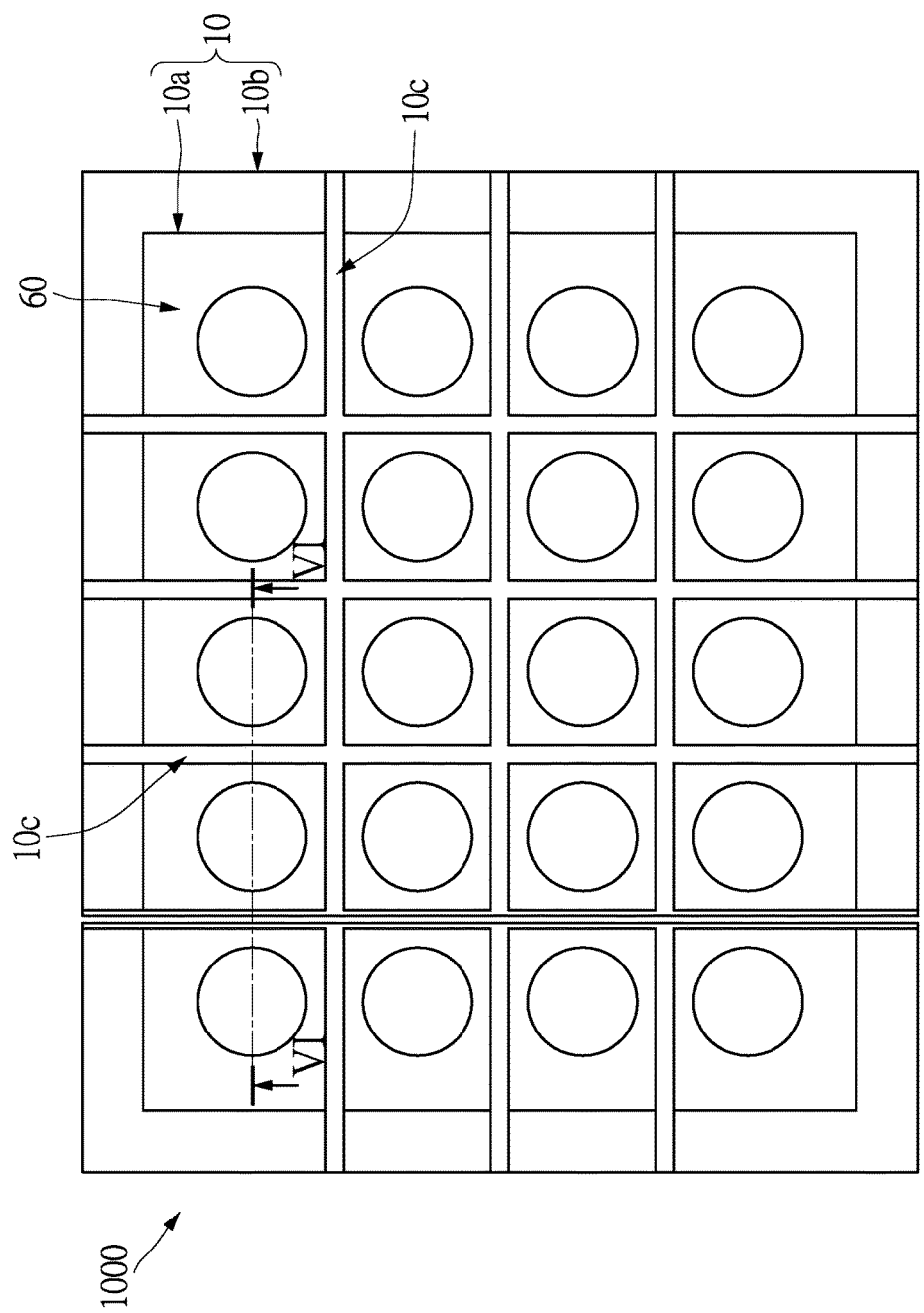
FIG. 5 is a schematic view showing a step S150 of the manufacturing method of the LED package structure.
Figure 6:
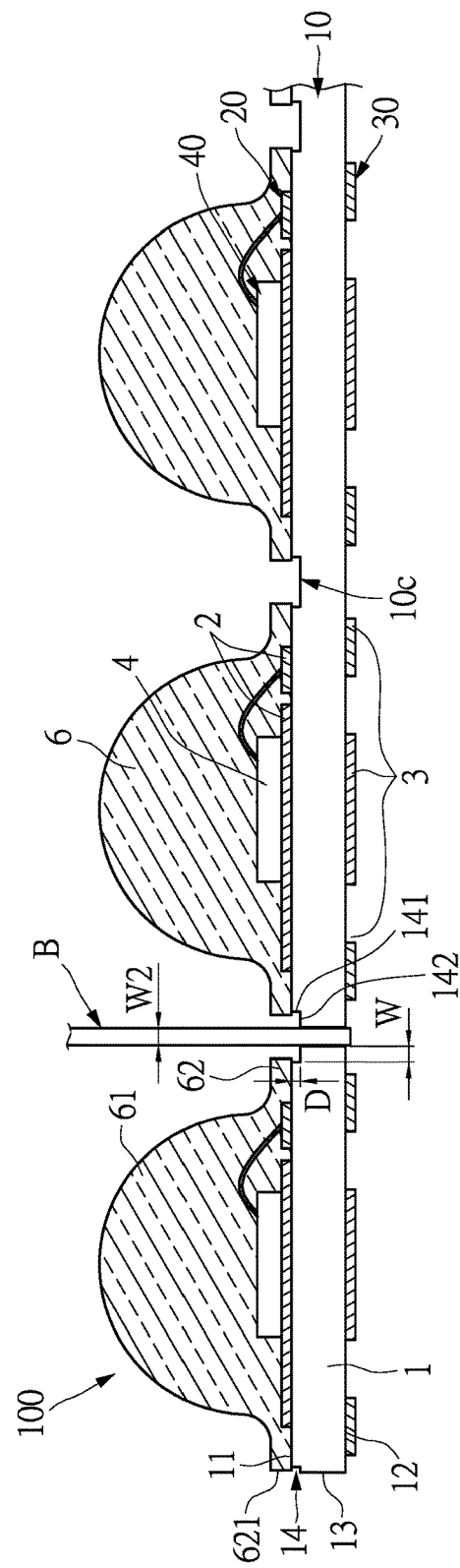
FIG. 6 is a cross-sectional view along line VI-VI of FIG. 5.
Figure 7:
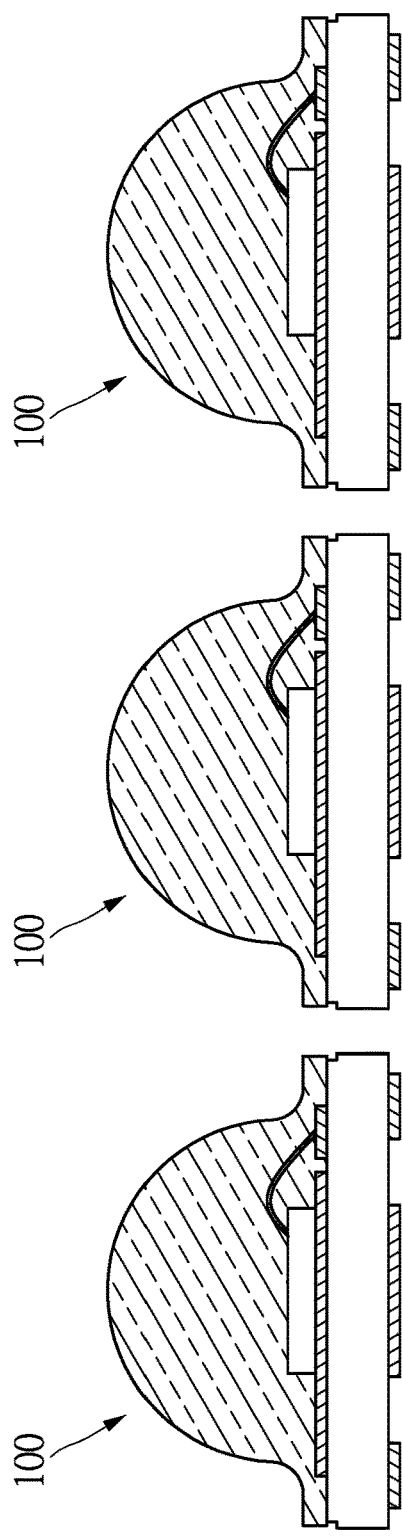
FIG. 7 is a cross-sectional view showing a plurality of LED package structures after implementing the manufacturing method.

In Step S150, as show in FIG. 5 through FIG. 7, the substrate layer 10 is sawed by using a second blade B to move along the sawing trace of the substrate layer 10 (i.e., the sawing lines L) until the second blade B saws through the substrate layer 10. The hardness of the second blade B is less than that of the substrate layer 10, and is less than that of the first blade P, so the second blade B is a soft blade with respect to the first blade P. The thickness W2 of the second blade B implemented on the substrate layer 10 is less than the thickness of the first blade P, and is less than or equal to 200 μm. In the instant embodiment, the second blade B is a disc-shaped blade, in which a plurality of diamond powders is adhered on the disc-shaped blade by a resin, and the second blade B is generally called as a B-blade. In other words, the second blade B is a resin-bonded diamond blade. The thickness W2 of the second blade B in the instant embodiment is 200 μm, but is not limited thereto. In the instant embodiment, the first blade P having the thickness W1 of 250 μm or 300 μm and the second blade B having the thickness W2 of 200 μm can be cooperated to saw the LED package structure assembly 1000 into a plurality of LED package structures 100.

When the second blade B is used to saw the substrate layer 10, the rotating speed of the second blade B is about 35000 rpm, the moving speed of the second blade B for sawing the substrate layer 10 is about 5 mm/s, velocity of a liquid for cooling the second blade B is about 1.5 L/min, and velocity of a liquid (e.g., water) for removing crumbs generated from the sawing of the substrate layer 10 is about 1 L/min at 20° C.

Specifically, after the sawing process of the second blade B is implemented, the substrate layer 10 is sawed to be a plurality of substrates 1 separated from each other. Each substrate 1 has a ring-shaped groove 14 in position corresponding to the sawing groove 10c, and a depth D of each groove 14 is substantially 75±25 μm. A portion of the side surface of each substrate 1 excluding the groove 14 is defined as an outer side surface 13. The groove 14 has an inner side surface 141 and a stepped surface 142, the inner side surface 141 is connected to the first board surface 11, and two opposite edges of the stepped surface 142 are respectively connected to the inner side surface 141 and the outer side surface 13. The depth D of the groove 14 is identical to a distance between the stepped surface 142 of the groove 14 and the first board surface 11 of the substrate 1. For each LED package structure 100, a side surface 621 of the second portion 62 of the encapsulating gel 6 protrudes from the first board surface 11 of the substrate 1 (or groove 14), a distance between the side surface 621 and the first board surface 11 is about 50±25 μm, and the outer side surface 13 is substantially aligned with the side surface 621. Moreover, a roughness (Ra) of the outer side surface 13 of each substrate 1 is about 1~4 μm.

After the above Steps S110, S130, S150 are implemented, the LED package structures 100 shown in FIG. 7 can be obtained, but each of the steps can be replaced by a reasonable replacement step. For example, in a non-shown embodiment, the step S130 can be replaced by a variety step S130', and the step S150 can be replaced by a variety step S150'. Specifically, the step S130' is sawing the second board surface 12 of the substrate layer 10 by using a second blade B to move along the sawing lines L, but the second blade B does not saw through the substrate layer 10; the step S150' is sawing the substrate layer 10 by using a first blade P to move along the sawing trace of the substrate layer 10 until the first blade P saws through the encapsulating gel layer 60.

[LED Package Structure]

The single LED package structure 100 as shown in FIG. 7 is disclosed in the following description. Some of the features of the LED package structure 100 (e.g., material features and construction features) have been disclosed in the above steps, so part of the same features is not disclosed in the following description again.

Figure 9:
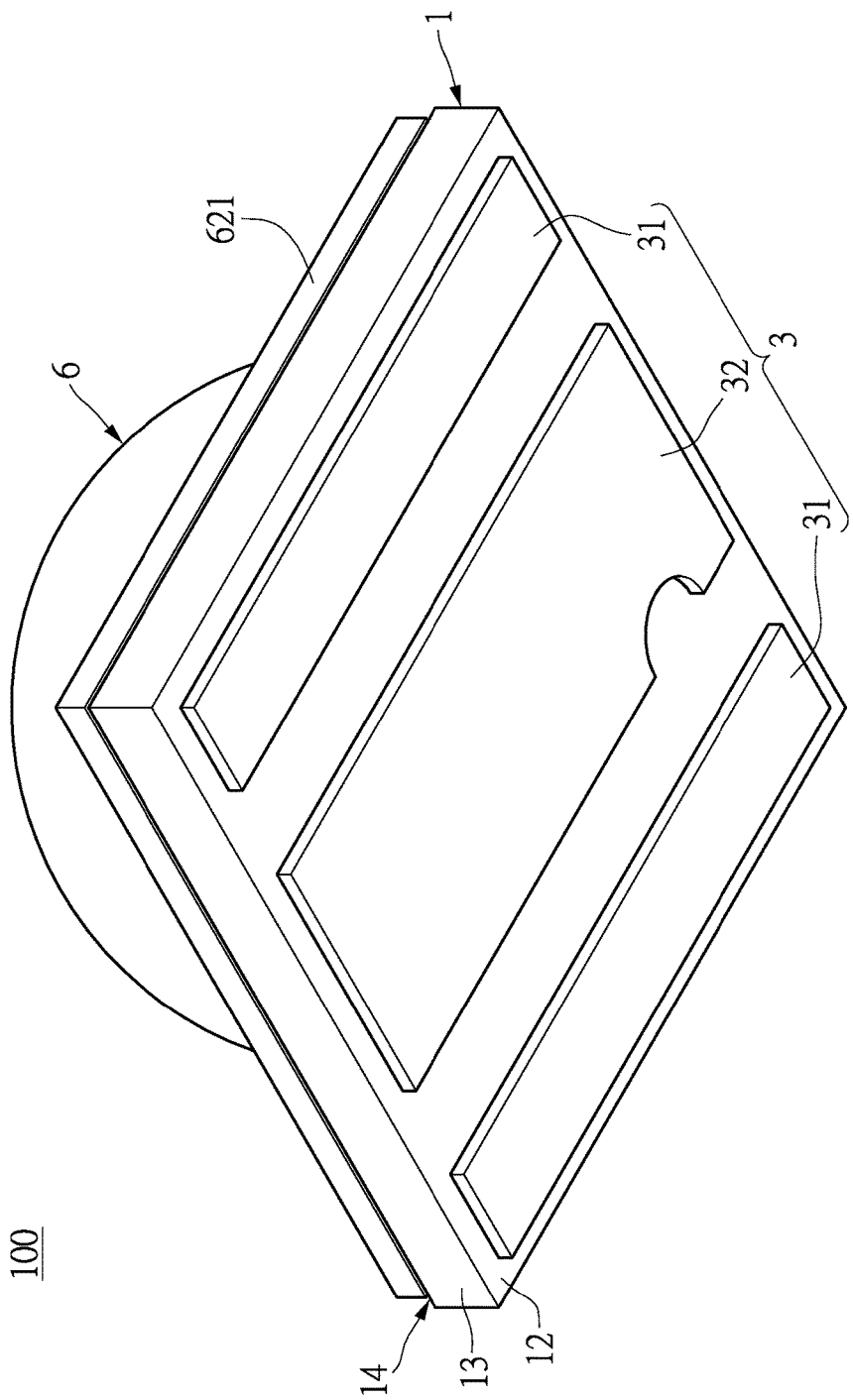
FIG. 9 is a perspective view the LED package structure from another perspective.

Please refer to FIG. 8 and FIG. 9, which show an LED package structure 100, in particular, a UV LED package structure 100. The LED package structure 100 in the instant embodiment is a UVA package structure 100, but is not limited thereto. For example, the LED package structure 100 having a wavelength of 200~420 nm can be provided.

Figure 10:
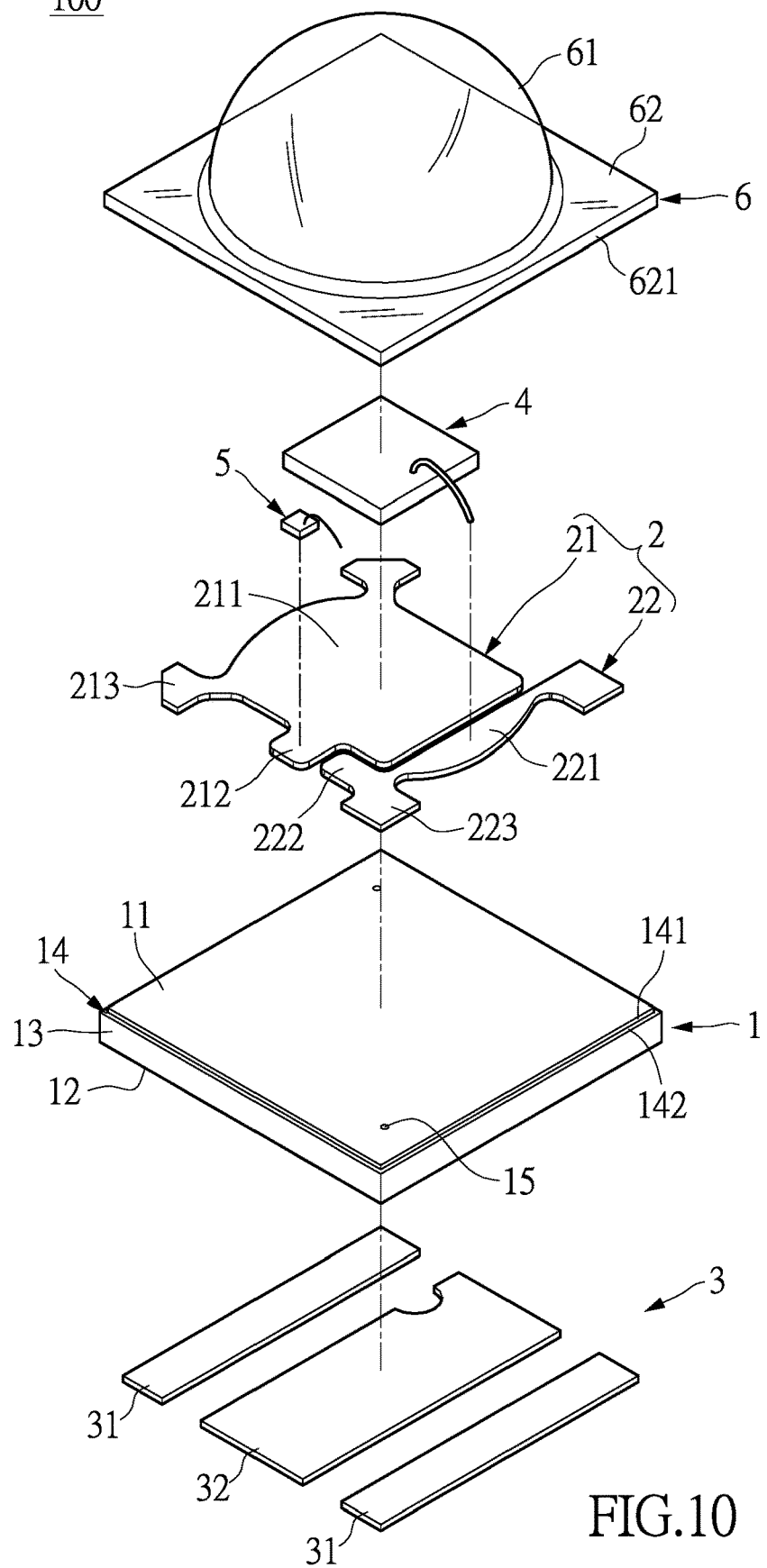
FIG. 10 is an exploded view of the LED package structure according to the instant disclosure.
Figure 11:
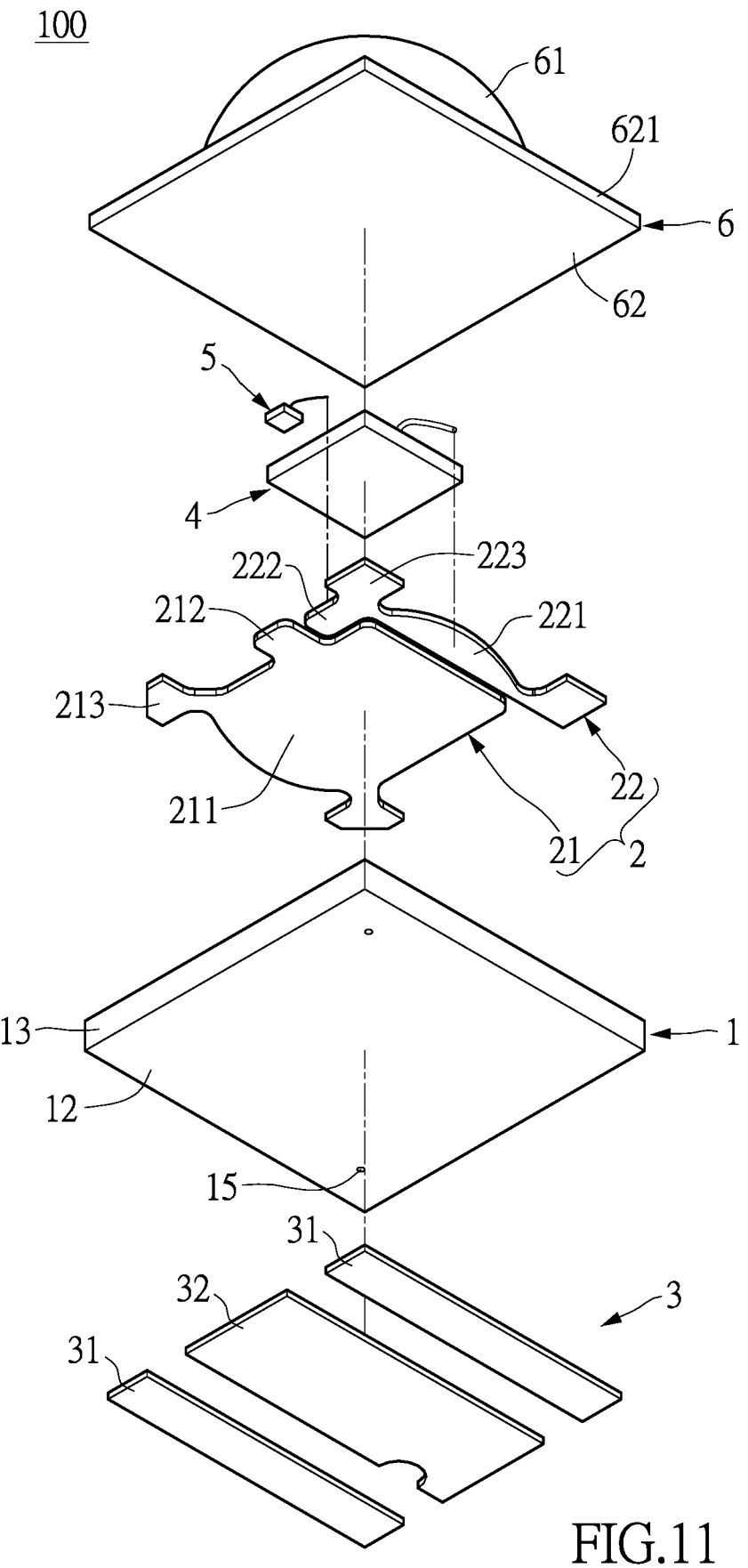
FIG. 11 is an exploded view of the LED package structure from another perspective.
Figure 12:
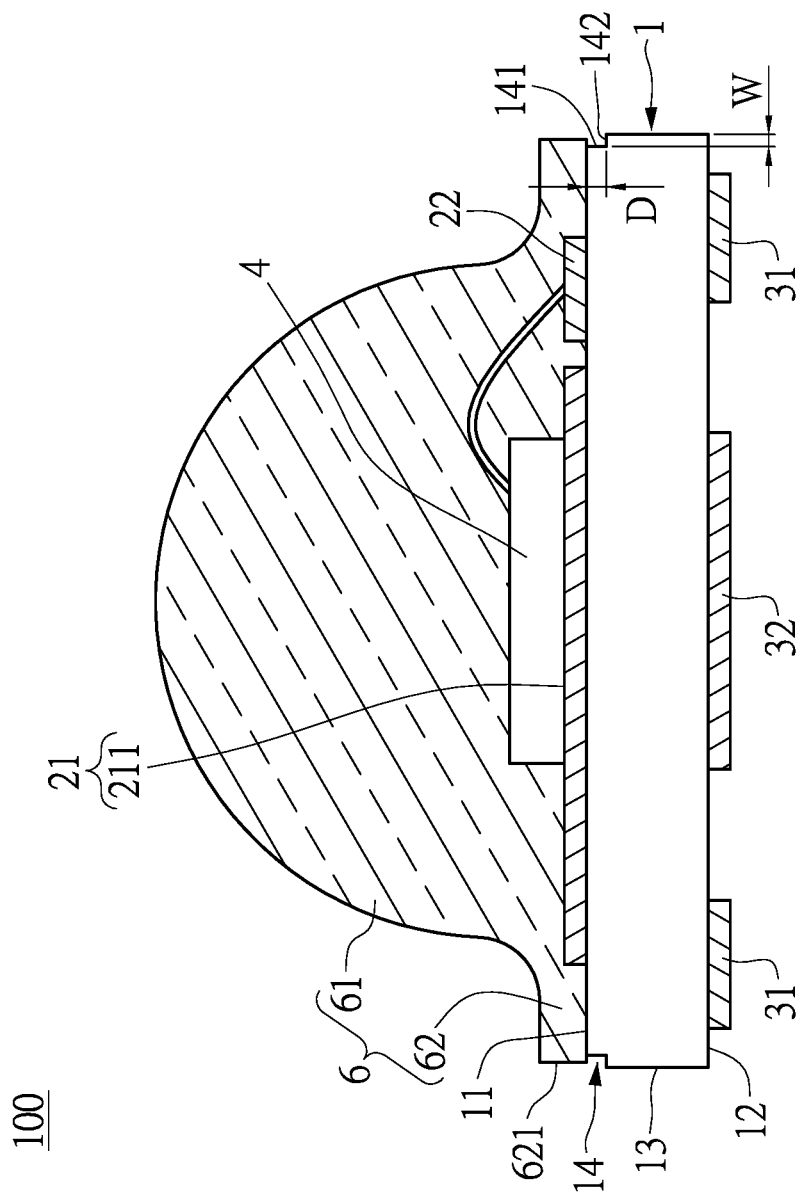
FIG. 12 is a cross-sectional view along line X II-X II of FIG. 8.
Figure 13:
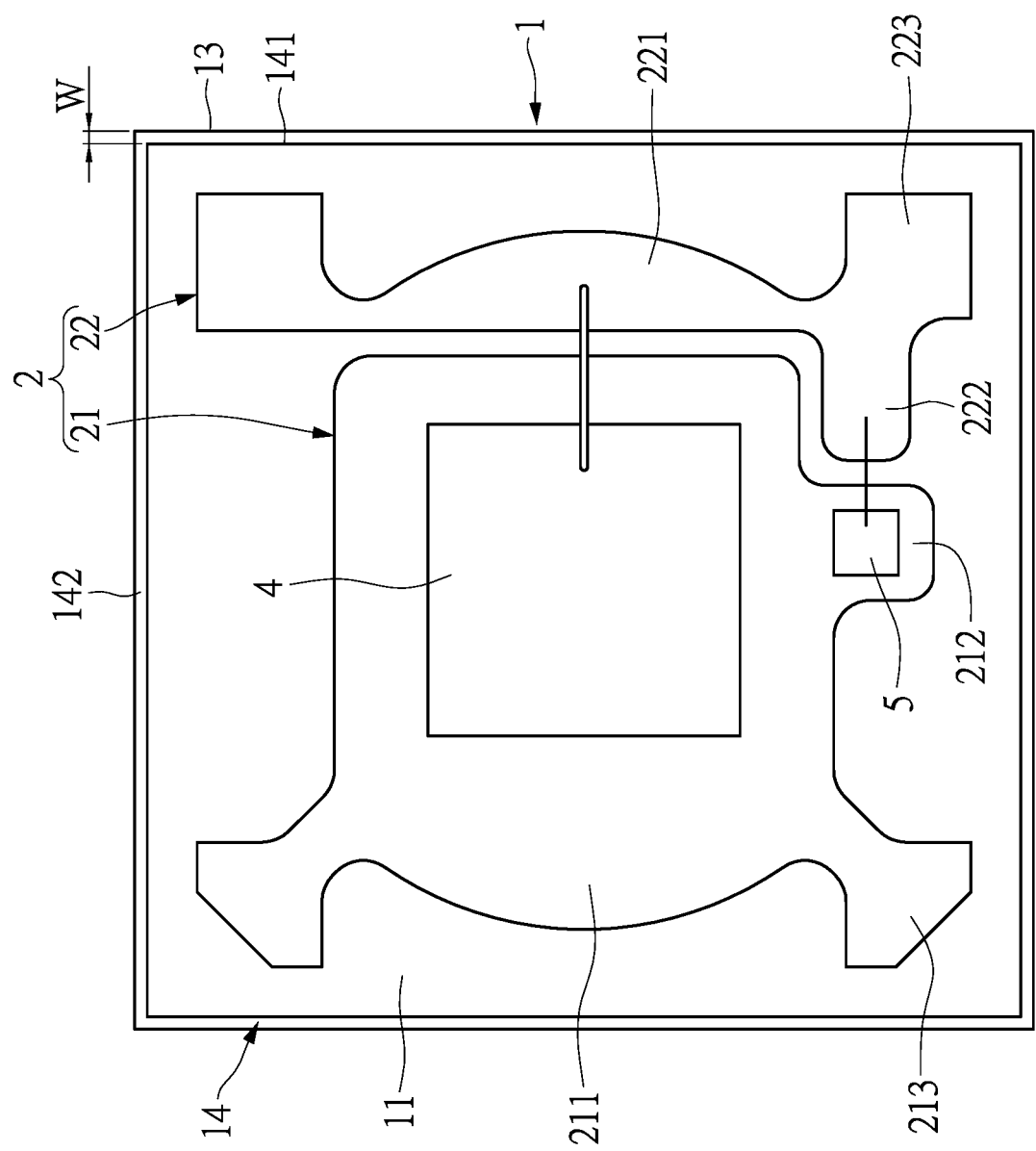
FIG. 13 is a top view of the LED package structure shown in FIG. 8 with the encapsulating gel omitted

Please refer to FIG. 10 and FIG. 11, and with reference occasionally made to FIG. 12 and FIG. 13. The LED package structure 100 includes a substrate 1, a conductive circuit 2, a metallic pad set 3, an LED chip 4, a Zener chip 5, and an encapsulating gel 6 covering the conductive circuit 2, the LED chip 4 and the Zener chip 5. The conductive circuit 2 and the metallic pad set 3 are respectively disposed on two opposite sides of the substrate 1. The LED chip 4 and the Zener chip 5 are both disposed on the conductive circuit 2.

The hardness of the substrate 1 is greater than that of the encapsulating gel 6, and the substrate 1 in the instant embodiment is a ceramic substrate, but material of the substrate 1 is not limited thereto. The substrate 1 having a square shape or a rectangular shape includes a first board surface 11, an opposite second board surface 12, an outer side surface 13 arranged between the first board surface 11 and the second board surface 12, and a ring-shaped groove 14 arranged between the first board surface 11 and the outer side surface 13. The groove 14 has an inner side surface 141 and a stepped surface 142, the inner side surface 141 is connected to the first board surface 11, and two opposite edges of the stepped surface 142 are respectively and perpendicularly connected to the inner side surface 141 and the outer side surface 13. Specifically, when the first board surface 11 is orthogonally projected onto the second board surface 12, an outer edge of the first board surface 11 is located inside an outer edge of the second board surface 12, and a distance between the outer edge of the first board surface 11 and the outer edge of the second board surface 12 is identical to the width W of the groove 14, which is about 50±25 μm. The width W of the groove 14 can be regarded as a distance between the inner side surface 141 and the outer side surface 13. A shortest distance between the first board surface 11 and the stepped surface 142 is the depth D of the groove 14, which is about 75±25 μm. In other words, the distance between the first board surface 11 and the stepped surface 142 can be regarded as the depth D of the groove 14.

The conductive circuit 2 is disposed on the first board surface 11 of the substrate 1 and includes a first circuit 21 and a second circuit 22. The area of the first circuit 21 is greater than the area of the second circuit 22. The first circuit 21 has an LED bonding portion 211 arranged on center of the first board surface 11, a Zener bonding portion 212 extended from a side edge of the LED bonding portion 211, and two first extending portions 213 extended from the LED bonding portion 211 respectively toward two corners of the substrate 1. The second circuit 22 has an LED wiring portion 221 arranged adjacent to the LED bonding portion 211, a Zener wiring portion 222 extended from the LED wiring portion 221 and arranged adjacent to the Zener bonding portion 212, and two second extending portions 223 extended from the LED wiring portion 221 respectively toward the other two corners of the substrate 1.

Moreover, the two first extending portions 213 and the two second extending portions 223 are respectively disposed on the four corners of the first board surface 11 of the substrate 1, and each first extending portion 213 has a cutout to construct a shape different from each second extending portion 223.

The metallic pad set 3 is disposed on the second board surface 12 of the substrate 1 and includes two soldering pads 31 and a heat dissipating pad 32 arranged between the two soldering pads 31. The two soldering pads 31 and the heat dissipating pad 32 are provided with elongated shapes, which are parallel to each other. Specifically, one of the two soldering pads 31 is arranged under one of the two first extending portions 213 and is electrically connected to the first circuit 21 by a conductive pillar 15, which is embedded in the substrate 1; the other soldering pad 31 is arranged under one of the two second extending portions 223 and is electrically connected to the second circuit 22 by a conductive pillar 15, which is embedded in the substrate 1. The heat dissipating pad 32 is substantially arranged under the LED bonding portion 211 of the first circuit 21.

The LED chip 4 is mounted on the LED bonding portion 211 of the first circuit 21 and is electrically connected to the conductive circuit 2. Specifically, when the LED chip 4 in the instant embodiment is a vertical chip, a chip electrode arranged on the bottom surface of the LED chip 4 is electrically connected to the first circuit 21, and a chip electrode arranged on the top surface of the LED chip 4 is electrically connected to the LED wiring portion 221 of the second circuit 22 by wire bonding; when the LED chip 4 is a horizontal chip (not shown), two chip electrodes arranged on the top surface of the LED chip 4, which respectively have two opposite polarities, are respectively and electrically connected to the first circuit 21 and the second circuit 22 by wire bonding.

In addition, the LED package structure 100 can further comprise a die-attaching adhesive (not shown), and the LED chip 4 can be bonded on the first circuit 21 of the conductive circuit 2 by using the die-attaching adhesive. In the instant embodiment, the adhesive is a nano-silver paste, the nano-silver paste is made of nano-silver powders without epoxy resin, and a volume percentage of the nano-silver powders of the nano-silver paste is about 85~90%, thereby the adhesive has good thermal resistance and a degradation problem is not easily occurred. Moreover, when the nano-silver powders have particle size smaller than 20 nm, the nano-silver powders having a weight percentage of 20~35% are provided for the nano-silver paste. When the nano-silver powders have particle size of 20~100 nm, the nano-silver powers having a weight percentage of 40~50% are provided for the nano-silver paste. When the nano-silver powders have particle size of 300 nm~2 μm, the nano-silver powers having a weight percentage of 10~20% are provided for the nano-silver paste. A binder being Isobornyl Cyclohexanol (IBCH) is provided with a weight percentage of 2~7%; a solution being 1-decanol is provided with a weight percentage of 5~15%. The chemical formula of the nano-silver paste is nAg-m(AgOOCR-l(AgOR), R=[CH3(CH2)x], and l, m, n, x are positive integers.

The Zener chip 5 is mounted on the Zener bonding portion 212 of the first circuit 21 and is electrically connected to the conductive circuit 2. The Zener chip 5 is fixed on and electrically connected to the Zener bonding portion 212 of the first circuit 21, and the Zener chip 5 is electrically connected to the Zener wiring portion 222 of the second circuit 22 by wire bonding.

The encapsulating gel 6 has a first portion 61 and a second portion 62 integrally formed around the first portion 61, and the thickness of the first portion 61 is greater than that of the second portion 62. The position of the first portion 61 is arranged at the center of the encapsulating gel 6 and is corresponding to the LED chip 4. The second portion 62 slightly protrudes from the first board surface 11 of the substrate 1, and the side surface 621 of the second portion 62 is substantially aligned with the outer side surface 13 of the substrate 1. Specifically, the term "substantially aligned" means that the side surface 621 of the second portion 62 is coplanar with the outer side surface 13 of the substrate 1, or the side surface 621 of the second portion 62 is not protruded from the outer side surface 13 of the substrate 1 and is arranged above the stepped surface 142. Moreover, the first portion 61 of the encapsulating gel 6 in the instant embodiment is a convex lens, but is not limited thereto.

[Possible Effects of the Embodiments of the Present Invention]

In summary, in the LED package structure and the manufacturing method thereof provided in the above embodiment of the instant disclosure, the encapsulating gel layer and part of the substrate layer are sawed by the first blade, and then part of the substrate layer is sawed by the second blade, which is softer and thinner than the first blade, so the side surface of the second portion of the encapsulating gel is substantially aligned with the outer side surface of the substrate, thereby effectively increasing the producing yield of the LED package structure.

The above description only provides preferred practical embodiments of the present invention, and is not intended to limit the scope of the present invention. All equivalent changes and modifications made according to the claims of the present invention should fall within the scope of the present invention.

What is claimed is:

1. A light-emitting diode (LED) package structure, comprising:
    a substrate having a first board surface, an opposite second board surface, four outer side surfaces arranged between the first board surface and the second board surface, wherein a groove is recessed on the first board surface and the four outer side surfaces of the substrate, and the groove is arranged around the first board surface and is located between the first board surface and each of the four outer side surfaces, wherein the groove has an inner side surface and a stepped surface, the inner side surface is connected to the first board surface, and two opposite edges of the stepped surface are respectively connected to the inner side surface and each of the four outer side surfaces;
    a conductive circuit disposed on the first board surface of the substrate;
    an LED chip mounted on the conductive circuit;
    an encapsulating gel disposed on the first board surface of the substrate and covering the conductive circuit and the LED chip, wherein the encapsulating gel has a first portion and a second portion arranged around the first portion, the second portion protrudes from the first board surface of the substrate, and the second portion has four side surfaces, the four side surfaces of the second portion are substantially aligned with the four outer side surfaces of the substrate, respectively, the second portion of the encapsulating gel is separated from the four outer side surfaces of the substrate by the groove, and wherein the encapsulating gel has a methyl silicone resin, and a Shore A hardness of the encapsulating gel is 50~70; and
    a metallic pad set disposed on the second board surface of the substrate and electrically connected to the conductive circuit.

2. The LED package structure of claim 1, wherein the conductive circuit includes a first circuit and a second circuit separated from the first circuit, an area of the first circuit is greater than that of the second circuit, wherein the first circuit has an LED bonding portion, a Zener bonding portion extended from the LED bonding portion, and two first extending portions extended from the LED bonding portion, the second circuit has an LED wiring portion, a Zener wiring portion extended from the LED wiring portion, and two second extending portions extended from the LED wiring portion; the LED chip is mounted on the LED bonding portion and is electrically connected to the LED wiring portion by wire bonding, a Zener chip is mounted on the Zener bonding portion and is electrically connected to the Zener wiring portion by wire bonding.

3. The LED package structure of claim 2, wherein the metallic pad set includes two soldering pads and a heat dissipating pad arranged between the two soldering pads, the two soldering pads are respectively and electrically connected to the first circuit and the second circuit by two conductive pillars embedded in the substrate.

4. The LED package structure of claim 1, wherein a distance between the inner side surface of the groove each of the four outer side surfaces of the substrate is defined as a width of the groove, and the width of the groove is substantially 50±25 μm.

5. The LED package structure of claim 1, wherein a distance between the stepped surface of the groove and the first board surface of the substrate is defined as a depth of the groove, and the depth of the groove is substantially 75±25 μm.

6. The LED package structure of claim 1, further comprising a die attaching adhesive, wherein the die attaching adhesive is a nano-silver paste made of nano-silver powders without epoxy resin.

7. The LED package structure of claim 1, wherein an elongation of the encapsulating gel is greater than 100% and smaller than 250%.

8. The LED package structure of claim 1, wherein the Shore A hardness of the encapsulating gel is 5060, an elongation of the encapsulating gel is greater than 160% and smaller than 190%, and a refractive index of the encapsulating gel is substantially 1.41.

9. The LED package structure of claim 1, wherein a thickness of the second portion of the encapsulating gel and a light-emitting angle of the LED chip are conformed to a formula: $\theta=138.75-(1.2T/25.4)$, wherein T is the thickness of the second portion of the encapsulating gel, and $\theta$ is the light-emitting angle of the LED chip.

10. The LED package structure of claim 1, wherein a thickness of the second portion of the encapsulating gel is less than that of the substrate and is in a range of 75~125 μm.

11. The LED package structure of claim 1, wherein the LED chip is a UVA LED chip having a wavelength of 350~420 nm.

12. The LED package structure of claim 1, wherein when the first board surface is orthogonally projected onto the second board surface, an outer edge of the first board surface is located inside an outer edge of the second board surface.

13. A light-emitting diode (LED) package structure, comprising:
a substrate having a first board surface, an opposite second board surface, an outer side surface arranged between the first board surface and the second board surface, and a groove arranged around the first board surface and located between the first board surface and the outer side surface, wherein the groove has an inner side surface and a stepped surface, the inner side surface is connected to the first board surface, and two opposite edges of the stepped surface are respectively connected to the inner side surface and the outer side surface;
a conductive circuit disposed on the first board surface of the substrate;
an LED chip mounted on the conductive circuit;
an encapsulating gel formed on the first board surface of the substrate and covering the conductive circuit and the LED chip, wherein the encapsulating gel has a first portion and a second portion arranged around the first portion, the second portion protrudes from the first board surface of the substrate, and a side surface of the second portion is substantially aligned with the outer side surface of the substrate; and
a metallic pad set disposed on the second board surface of the substrate and electrically connected to the conductive circuit,
wherein the conductive circuit includes a first circuit and a second circuit separated from the first circuit, an area of the first circuit is greater than that of the second circuit, wherein the first circuit has an LED bonding portion, a Zener bonding portion extended from the LED bonding portion, and two first extending portions extended from the LED bonding portion, the second circuit has an LED wiring portion, a Zener wiring portion extended from the LED wiring portion, and two second extending portions extended from the LED wiring portion; the LED chip is mounted on the LED bonding portion and is electrically connected to the LED wiring portion by wire bonding, a Zener chip is mounted on the Zener bonding portion and is electrically connected to the Zener wiring portion by wire bonding.

14. The LED package structure of claim 13, wherein the metallic pad set includes two soldering pads and a heat dissipating pad arranged between the two soldering pads, the two soldering pads are respectively and electrically connected to the first circuit and the second circuit by two conductive pillars embedded in the substrate.

15. The LED package structure of claim 13, wherein the encapsulating gel has an elongation is greater than 100% and smaller than 250%.

16. The LED package structure of claim 14, wherein a thickness of the second portion of the encapsulating gel and a light-emitting angle of the LED chip are conformed to a formula: $\theta=138.75-(1.2T/25.4)$, wherein T is the thickness of the second portion of the encapsulating gel, and $\theta$ is the light-emitting angle of the LED chip.

17. A light-emitting diode (LED) package structure, comprising:
a substrate having a first board surface, an opposite second board surface, four outer side surfaces arranged between the first board surface and the second board surface, wherein a groove is recessed on the first board surface and the four outer side surfaces of the substrate, and the groove is arranged around the first board surface and is located between the first board surface and each of the four outer side surfaces, wherein the groove has an inner side surface and a stepped surface, the inner side surface is connected to the first board surface, and two opposite edges of the stepped surface are respectively connected to the inner side surface and each of the four outer side surfaces;
a conductive circuit disposed on the first board surface of the substrate;
an LED chip mounted on the conductive circuit;
an encapsulating gel disposed on the first board surface of the substrate and covering the conductive circuit and the LED chip, wherein the encapsulating gel has a first portion and a second portion arranged around the first portion, the second portion protrudes from the first board surface of the substrate, and the second portion has four side surfaces, the four side surfaces of the second portion are substantially aligned with the outer side surfaces of the substrate, respectively, the second portion of the encapsulating gel is separated from the four outer side surfaces of the substrate by the groove, and wherein the encapsulating gel has a methyl silicone resin, and a Shore A hardness of the encapsulating gel is 50~70, so that the four side surfaces of the second portion protrude from the first board surface of the substrate so as to be arranged above the stepped surface, and are not protruded from the four outer side surfaces of the substrate; and a metallic pad set disposed on the second board surface of the substrate and electrically connected to the conductive circuit.

18. The LED package structure of claim 17, wherein the conductive circuit includes a first circuit and a second circuit separated from the first circuit, an area of the first circuit is greater than that of the second circuit, and the metallic pad set includes two soldering pads respectively and electrically connected to the first circuit and the second circuit by two conductive pillars embedded in the substrate.

19. The LED package structure of claim 17, wherein the encapsulating gel has an elongation is greater than 100% and smaller than 250%.

20. The LED package structure of claim 17, wherein a thickness of the second portion of the encapsulating gel and a light-emitting angle of the LED chip are conformed to a formula: $\theta=138.75-(1.2T/25.4)$, wherein T is the thickness of the second portion of the encapsulating gel, and $\theta$ is the light-emitting angle of the LED chip.

\* \* \* \* \*